United States Patent
Toprac

[19]

[11] Patent Number: 6,130,414
[45] Date of Patent: Oct. 10, 2000

[54] SYSTEMS AND METHODS FOR CONTROLLING SEMICONDUCTOR PROCESSING TOOLS USING MEASURED CURRENT FLOW TO THE TOOL

[75] Inventor: Anthony J. Toprac, Austin, Tex.

[73] Assignee: Advanced Micro Devices, Inc., Austin, Tex.

[21] Appl. No.: 09/136,486

[22] Filed: Aug. 19, 1998

[51] Int. Cl.$^7$ ................................................. H05B 1/02
[52] U.S. Cl. ........................ 219/497; 219/505; 374/183; 374/184; 374/185
[58] Field of Search .................. 374/183–185; 219/497, 505

[56] References Cited

U.S. PATENT DOCUMENTS

| | | | |
|---|---|---|---|
| 3,715,446 | 2/1973 | Kosinski . | |
| 4,207,137 | 6/1980 | Tretola . | |
| 4,222,838 | 9/1980 | Bhagat et al. . | |
| 4,400,613 | 8/1983 | Popelish | 219/497 |
| 4,493,984 | 1/1985 | Yamauchi | 219/501 |
| 4,680,451 | 7/1987 | Gat et al. | 219/411 |
| 4,764,652 | 8/1988 | Lee | 219/627 |
| 4,816,986 | 3/1989 | Spiridonov et al. | 363/132 |
| 5,397,874 | 3/1995 | Griffith | 219/497 |
| 5,528,226 | 6/1996 | Brown et al. | 340/664 |
| 5,534,680 | 7/1996 | Kadwell et al. | 219/505 |
| 5,669,038 | 9/1997 | Kishimoto | 399/67 |
| 5,690,849 | 11/1997 | DeVilbiss et al. | 219/497 |

OTHER PUBLICATIONS

Fordham, M.J. et al., "Emissivity Correcting Pyrometer for Temperature Measurement in Low Pressure Chemical Vapor Deposition", *IEEE*, pp. 223–228 (1993).

Gyurcsik, R. et al., "A Model for Rapid Thermal Processing: Achieving Uniformity Through Lamp Control", *IEEE Transactions on Semiconductor Manufacturing*, vol. 4, No. 1, pp. 9–13 (Feb. 1991).

Harnish, M.J., "Answers to Frequently Asked Questions", http://www.theshop.net/lihr/Waldo/oldfaq.htm, pp. 1–9, (Revised Sep. 12, 1997).

Kermani, A., "Single Wafer Integrated Processing as a Manufacturing Tool Using Rapid Thermal Chemical Vapor Deposition Technology", *Proceedings/SPIE—Rapid Thermal and Related Processing Techniques*, vol. 1393, pp. 109–119 (Oct. 2–3, 1990).

Morrill, S., "Everything You Always Wanted to Know About Pickups . . . but were Afraid to Ask", *E.U Wurlitzer Technical Articles*, http://www.wurlitzer.com/articles/pickups/html, pp. 1–3.

Ozturk, M.C. et al., "Manufacturability Issues in Rapid Thermal Chemical Vapor Deposition", *IEEE Transactions on Semiconductor Manufactoring*, vol. 4, No. 2, pp. 155–165 (May 1991).

(List continued on next page.)

*Primary Examiner*—Teresa Walberg
*Assistant Examiner*—Jeffrey Pwu
*Attorney, Agent, or Firm*—Williams, Morgan & Amerson, P.C.

[57] ABSTRACT

Systems and methods for controlling the temperature or other characteristic of semiconductor processing tools by measuring current flow to the tool is provided. In one embodiment, a current sensor is provided for measuring current flow to the heat source and generating an electrical signal proportional to the current flow. The current sensor includes a noise filter for reducing noise in the electrical signal induced by stray emf signals present around the processing tool. A controller, responsive to the electrical signal generated by the current sensor, is provided for controlling the processing tool. In this manner, the controller can, for example, allow for early detection of heat source failures or degradation. When such a condition is detected, the controller may, for instance, signal an audible or visual warning or shut down the processing tool.

20 Claims, 2 Drawing Sheets

OTHER PUBLICATIONS

Peters, L., "The Hottest Topic in RTP", *Semiconductor International*, pp. 56–63 (Aug. 1991).

Rosser, P.J. et al., "Multi–Chamber Rapid Thermal Processing", *Proceedings/SPIE—Rapid Thermal and Related Processing Techniques*, vol. 1393, pp. 49–66 (1990).

Saraswat, K.C. et al., "Rapid Thermal Multiprocessing for Micro Factories", *Proceedings/SPIE—Rapid Isothermal Processing*, vol. 1189, pp. 2–14 (Oct. 12–13, 1989).

Sorrell, F. et al., "A Global Model for Rapid Thermal Processors", *IEEE Transactions on Semiconductor Manufacturing*, vol. 3, No. 4, pp. 183–188 (Nov. 1990).

Vandenabeele, P. et al., "Emissivity of Silicon Wafers During Rapid Thermal Processing", *Proceedings/SPIE—Rapid Thermal and Related Processing Techniques*, vol. 1393, pp. 316–336 (1990).

Vandenabeele, P. et al., "Round–Robin of Temperature Non–Uniformity During RTP Due to Patterned Layers", *Proceedings/SPIE—Rapid Thermal and Related Processing Techniques*, vol. 1393, pp. 372–394 (1990).

Watanabe, T. et al., "Radiation Thermometry of Silicon Wafers in a Diffusion Furnace for Fabrication of LSI", *IEEE Transactions on Semiconductor Manufactoring*, vol. 4, No. 1, pp. 59–63 (Feb. 1991).

Wood, S. et al., "Pyrometer Modeling for Rapid Thermal Processing", *SPIE—Rapid Thermal and Related Processing Techniques*, vol. 1393, pp. 337–347 (1990).

Wood, S. et al., "The Economic Impact of Single Wafer Multiprocessors", *SPIE—Rapid Thermal and Related Processing Techniques*, vol. 1393, pp. 36–48 (1990).

SYSTEMS AND METHODS FOR CONTROLLING SEMICONDUCTOR PROCESSING TOOLS USING MEASURED CURRENT FLOW TO THE TOOL

BACKGROUND OF THE INVENTION

1. Field of the Invention

This invention relates in general to systems and methods for controlling semiconductor processing tools, and more particularly, to systems and methods for controlling heating by a processing tool by measuring current flow to the heat source of the tool.

2. Description of Related Art

Semiconductor fabrication uses a wider variety of processing tools, a large number of which heat semiconductor wafers. Rapid thermal annealing, in particular, has become one of the key process steps in the production of semiconductor devices. One of the most important issues during this fabrication process is the control of wafer temperature. Take dopant activation, for example. A rapid thermal annealing (RTA) temperature which is too low will cause insufficient alignment of the dopants in the crystal structure causing the channel to have high resistivity. A rapid thermal annealing temperature which is too high can, for example, cause dopant penetration into undesirable areas of the wafer. As such, precise control of the wafer temperature during the rapid thermal annealing process is directly related to the expected yields from a processing run.

To control the wafer temperature during RTA processing, an optical pyrometer measuring system is typically utilized which measures the back side radiation off the wafer at infrared wavelengths (typically 2.7 microns). This pyrometer output is used in a closed loop feedback system to control the pulse width modulation signal to the halogen lamps which heat the wafer during the rapid thermal annealing process. The backside radiation off various wafers, however, varies widely. This causes the pyrometric output signal used to measure the chamber temperature to possess a wider than desired variance over the useful temperature distribution. This problem causes a lack of repeatability from wafer to wafer at a given temperature.

Additional errors in pyrometric temperature measurement result from variations in the backside film thickness of the wafers. Attempts to overcome the limitations of pyrometry temperature measurement systems have included the use of dual wavelength techniques for providing additional control over temperature measurements. These techniques have been used experimentally. While they appear to improve the results for thin film systems, they offer little improvement for thicker films systems. Moreover, these techniques increase cost and complexity of the system.

Other methods have been used in an effort to overcome the limitations of pyrometer systems. One such method includes measuring two optical parameters in an effort to measure the emitted radiation directly and the emissivity directly. In this type of system, the reflectivity of the wafer is measured as a means to calculate the emissivity. While tighter control over wafer temperature can be obtained, this method is also more costly and complicated. As a result, it can be seen that there is a need for a less complicated and inexpensive way of controlling the chamber temperature during rapid thermal annealing process.

SUMMARY OF THE INVENTION

The present invention generally provides systems and methods for controlling the heating or other characteristic of semiconductor processing tools by measuring current flow to the tool. In one embodiment, a current sensor is provided for measuring current flow to the heat source and generating an electrical signal proportional to the current flow. The current sensor includes a noise filter for reducing noise in the electrical signal induced by stray emf signals present around the processing tool. A controller, responsive to the electrical signal generated by the current sensor, is provided for controlling the processing tool. In this manner, the controller can, for example, allow for early detection of heat source failures or degradation. When such a condition is detected, the controller may, for instance, signal an audible or visual warning or shut down the processing tool.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
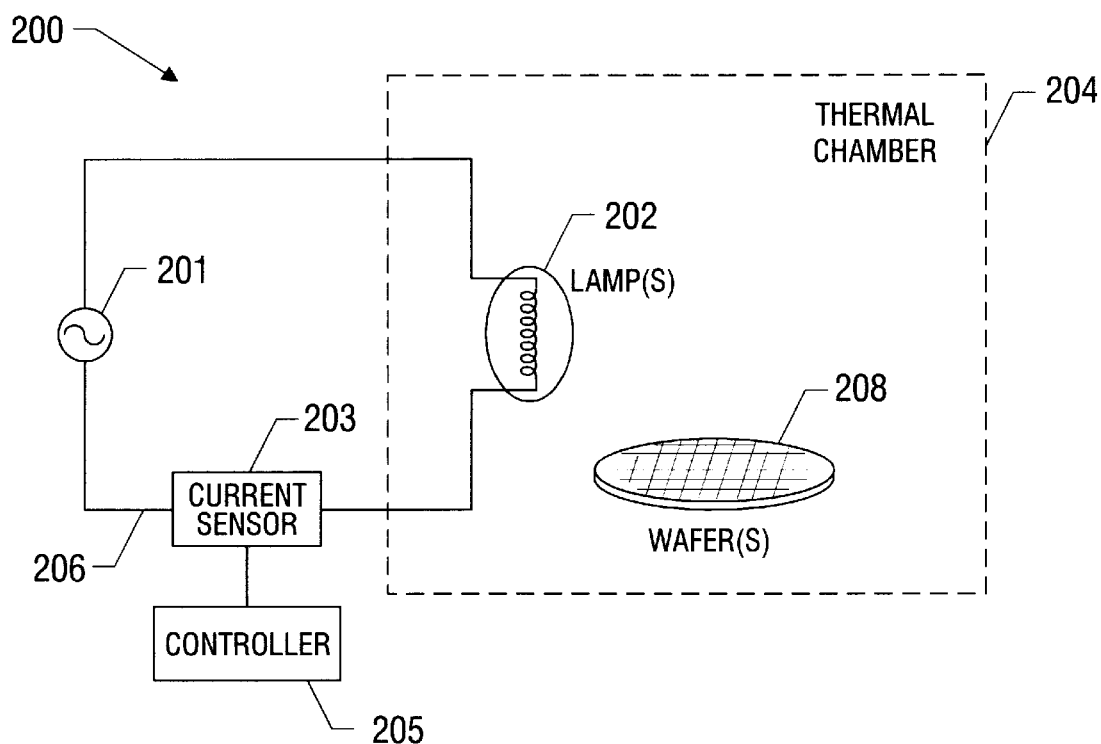
FIG. 1 illustrates an exemplary rapid thermal anneal (RTA) processing tool in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention provides systems and methods for controlling the temperature or other characteristic of a processing tool by measuring current flow to the tool. The invention may be used to control a tool used to heat semiconductor wafers during the wafer fabrication process. By way of example, the embodiment discussed below will relate to heating wafers as part of a rapid thermal annealing process. The present invention can, of course, be used to control the temperature (or other characteristic associated with current flow) of other fabrication tools without departing from the spirit and scope of the present invention discussed herein.

FIG. 1 illustrates an exemplary rapid thermal anneal (RTA) processing tool in accordance with one embodiment of the invention. The RTA tool 200 generally includes a thermal chamber 204 for storing and heating wafer(s) 208 and a heat source, such as one or more halogen lamps 202, for heating the wafer 208. The lamps 202 are typically powered by a current source, such as an alternating current source 201. The thermal energy emitted by the halogen lamp 202 is generally related to the current which flows to the lamp 202. In accordance with one aspect of the invention, a current sensor 203 is connected to the conductor 206 carrying the current from the current source 201 to the lamps 202. The current sensor 203 generally measures the current to the lamps 202 and provides an output signal to a controller 205 for controlling the RTA tool based on the sensed current flow. Controller 205 may apply a number of different corrective measures in order to manage or control the RTA tool 200. For example, the controller 205 may signal an audible or visual warning, shut down the RTA processing tool, and/or adjusting the current flow to the halogen lamps. In this manner, the controller 203 can, for example, allow for early detection of lamp failures or degradation.

In operation, the wafer(s) 208 in the RTA chamber 204 is heated to a desired temperature by applying current to the tool's heat source 202. The current sensor 203 measures the current provided and provides an output signal to the controller 205. Based on the measured current, the controller 204 controls the RTA tool 200. The controller 205 may, for example, be a digital controller which periodically samples the output signal from the current sensor 203. The controller 205 typically determines whether the current or a function of current (e.g., power) is within predetermined limits and responds accordingly. The controller 205 may, for example, determine whether the current flow at any particular time deviates a certain amount from an expected value. Alternatively, the controller 205 may determine the total power provided to the heat lamps 202 over a complete RTA cycle using the measured current. The total power may then be used to determine whether the tool is operating properly. For instance, the amount of power provided to the heat source 202 should typically remain constant from RTA cycle to RTA cycle for a similar product run. By determining the total power consumed by the heat source 202 for a particular run, deviations in the total power consumed from run to run and trends in total power consumed may be identified and appropriate corrective action may be taken. While not shown, the current sensor 203 and controller 205 may be used in combination with, for example, pyrometric temperature control to more closely control chamber temperature during manufacturing.

Figure 2:
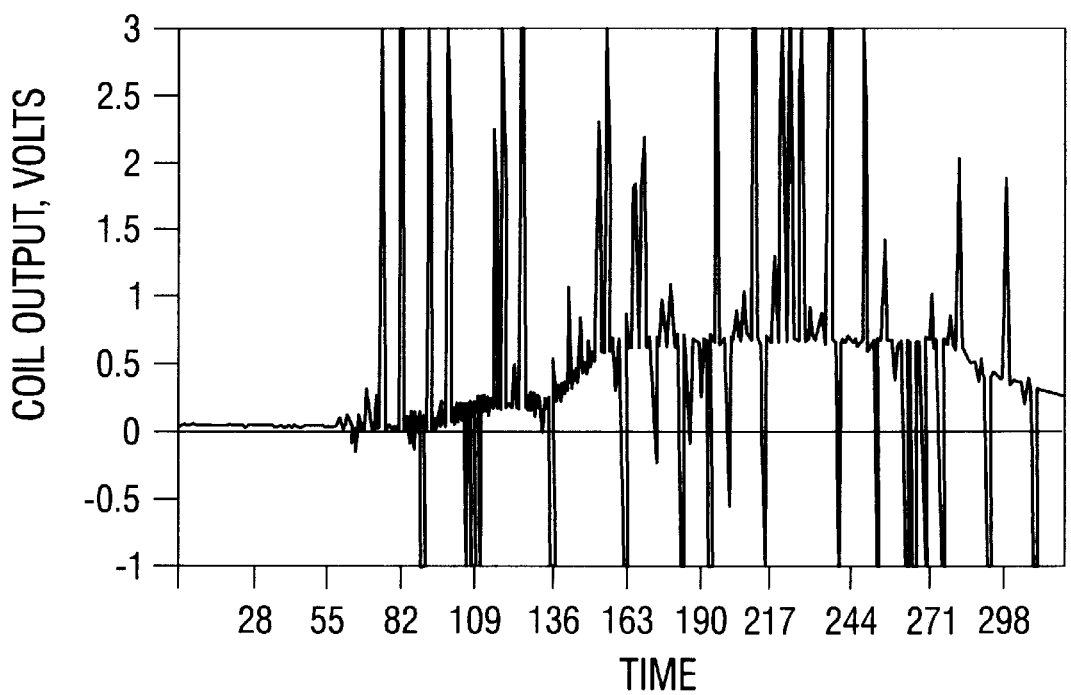
FIG. 2 is a graph illustrating noise in the RTA environment.

The current sensor 203 may, for example, be a single coil wrapped around the conductor 206 and coupled to a voltmeter for measuring induced voltage in the coil as a result of current flow in the conductor 206. One particular problem found in the application of a single-coil current sensor 203 is noise. FIG. 2 illustrates a current level (measured in volts) over a period time for an exemplary RTA cycle. As can be seen in FIG. 2, the output voltage is associated with significant noise in the form of spikes. This noise degrades the output signal and limits the use of current sensing as a means of controlling the RTA tool.

Figure 3:
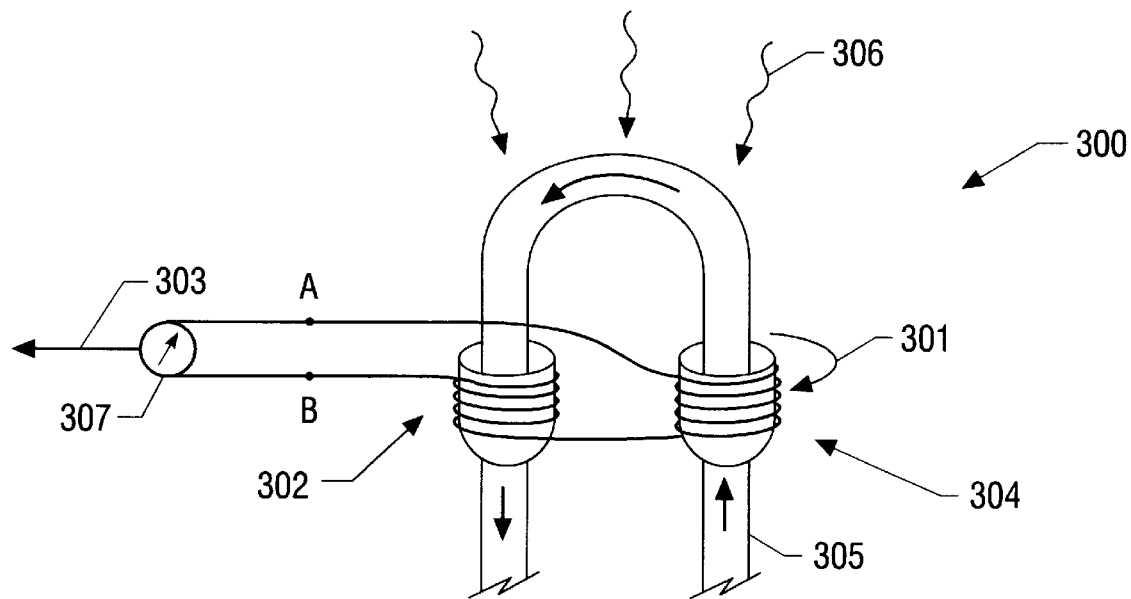
FIG. 3 illustrates an exemplary noise filtering current sensor in accordance with another embodiment of the invention.

It has been determined that the noise primarily results from stray electromotive force (emf) present around the RTA tool. In accordance with a further aspect of the invention, a noise filtering current sensor is provided which reduces signal noise resulting from stray EMF signals. FIG. 3 is a schematic diagram illustrating an exemplary current sensing device which filters noise in accordance with one embodiment of the invention. The current sensing device 300 generally includes a coil circuit 301 having a first coil 302 wrapped around a conductor 305 (between a current source and heat source) in a first direction (shown as a counterclockwise direction in FIG. 3) and a second coil 304 wrapped around the conductor 305 in a second direction opposite the first direction (e.g., clockwise as shown in FIG. 3). The conductor 305 is disposed through the coils 302 and 304 in opposite directions such that each coil 302 and 304 lies in the same direction relative to the current flow in the conductor 305. The two coils 302 and 304 typically have the same number of turns and lie parallel to one another. The coils 302 and 304 are serially connected and may be formed from one coil if desired. In operation, as current in the conductor 305, flows through the coils 302 and 304, a current equal to twice the current of a single coil is induced in the coil circuit 301. Advantageously, by virtue of the opposing orientations of the coils 302 and 304, any current induced in the coils 302 and 304 by stray emf 306 is canceled. In this manner, noise resulting from the stray emf 306 is filtered. The induced current in the coil circuit 301 can be measured as a voltage across terminals A and B using a voltmeter 307. The output 303 of the voltmeter 307 may be provided to a controller for controlling the associated RTA tool.

Figure 4:
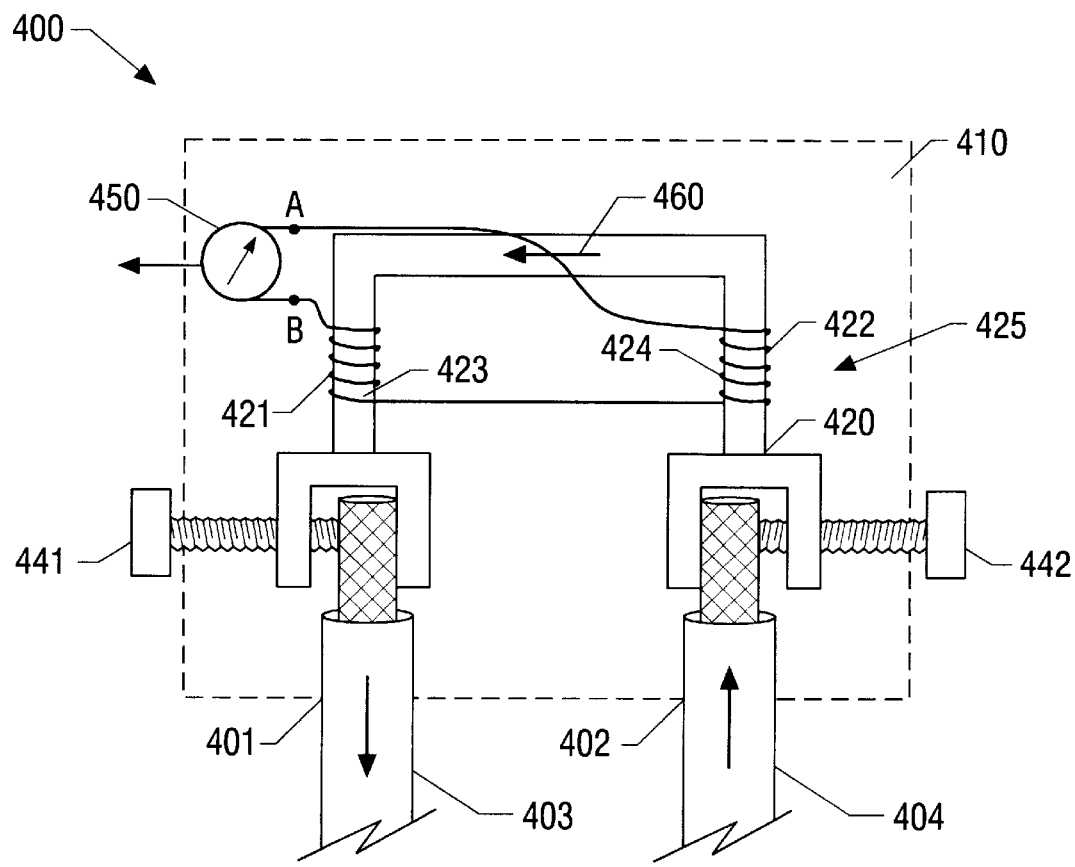
FIG. 4 illustrates an exemplary noise filtering current sensor in accordance with yet another embodiment of the invention.

FIG. 4 illustrates an exemplary noise filtering current sensor 400 in accordance with another embodiment of the present invention. This illustrative current sensor 400 can, for example, allow for easy attachment to existing semiconductor fabrication tools. The current sensor 400 includes a block of insulating material 410 which has two openings 401 and 402 for receiving conductors 403 and 404 carrying current for a heat source, such as one or more halogen lamps. The two conductors 403 and 404 are connected to a conductive terminal block 420 using screws 441 and 442. The terminal block 420 is encased in the insulating block 410 and electrically couples the two conductors 403 and 404 to form a circuit through which current 460 may flow. The conductive terminal block 420 typically includes two legs 423 and 424 which are parallel. A coil circuit 425 is provided which includes two serially arranged coils 421 and 422. The coils 421 and 422 are wrapped about the conductive terminal block legs 423 and 424 in opposite directions.

In a similar manner as discussed above, as current 460 flows through the coils 421 and 422, a current is induced in the coil circuit 425 while any current induced in the coils 421 and 422 by stray emf is canceled. In this manner, noise resulting from the stray emf is filtered. The induced current in the coil circuit 425 can then be measured using, for example, a voltmeter 450, the output of which may be provided to a controller for controlling the associated RTA tool. A potentiometer (not shown) can be added across reference terminals A and B to vary the range of voltage for calibration purposes. The output signal from the voltage meter 450 is typically provided to a controller (not shown) and may be amplified and/or filtered using standard techniques to provide an output signal within a desired range for measurement purposes.

The present invention is applicable to a number of different fabrication tools which may be controlled by measuring current flow to the tool. Accordingly, the present invention cannot be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed, upon review of the present specification. The claims are intended to cover such modifications and devices.

I claim:

1. An apparatus for controlling a semiconductor processing tool having an electrically powered heat source for heating a chamber of the semiconductor processing tool, comprising:

a current sensor for measuring current flow to the electrically powered heat source for heating the chamber of the semiconductor processing tool and generating an electrical signal proportional to the current flow, wherein the current sensor includes a noise filter for reducing noise in the electrical signal induced by stray emf signals present around the semiconductor processing tool; and a controller responsive to the electrical signal generated by the current sensor for controlling the semiconductor processing tool.

2. The apparatus according to claim 1, wherein the noise filter includes:

a first conductive coil wrapped, in a first direction relative to a reference point, around a conductor providing the current flow to the electrically powered heat source; and a second conductive coil wrapped around the conductor in a second direction opposite the first direction.

3. The apparatus of claim 2, wherein the first conductive coil and the second conductive coil are serially connected.

4. The apparatus according to claim 2, wherein the first conductive coil and second conductive coil are wrapped around the conductor in the same direction relative to the current flow.

5. The apparatus according to claim 2, wherein the current sensor further includes a voltmeter coupled between the first and second conductive coils for generating the electrical signal proportional to the current flow.

6. The apparatus according to claim 1, further including an insulating block disposed about the current sensor, the insulating block including two openings each receiving a conductor which carries the current flow to the tool.

7. The apparatus according to claim 1, wherein the electrically powered heat source includes one or more halogen lamps.

8. The apparatus according to claim 1, wherein the controller signals a visual warning signal in response to the electrical signal.

9. The apparatus according to claim 1, wherein the controller signals a auditory warning signal in response to the electrical signal.

10. The apparatus according to claim 1, wherein the controller shuts down the heat source in response to the electrical signal.

11. A device for measuring the current flow to a semiconductor processing tool, comprising:

an insulating block defining two openings each capable of receiving one or two conductors for carrying current to the semiconductor processing tool;

a conductive terminal block capable of electrically coupling the two conductors to form a path through which the current to the semiconductor processing tool flows; and a current sensor coupled to the conductive terminal block for measuring the current flow to the electrically powered heat source and generating an electrical signal proportional to the current flow, wherein the current sensor includes a noise filter for reducing noise in the electrical signal induced by stray emf signals present around the semiconductor processing tool.

12. The device according to claim 11, wherein the noise filter includes:

a first conductive coil wrapped around the conductive terminal block in a first direction relative to a reference point; and a second conductive coil wrapped around the conductive terminal block in a second direction opposite the first direction.

13. The device of claim 12, wherein the first conductive coil and the second conductive coil are serially connected.

14. The device according to claim 12, wherein the first conductive coil and second conductive coil are wrapped around the conductive terminal block in the same direction relative to the current.

15. The device according to claim 12, wherein the first conductive coil is disposed in parallel with second conductive coil.

16. The device according to claim 11, further including two screws for holding the conductors against the conductive terminal block.

17. A method for controlling a semiconductor processing tool having an electrically powered heat source for heating a chamber of the tool, comprising:

inducing current in a first circuit proportional to current flow to the electrically powered heat source;

filtering noise in the induced current from stray emf signals present around the semiconductor processing tool;

generating an electrical signal based on the induced current; and controlling the semiconductor processing tool in response to the electrical signal.

18. The method according to claim 17, wherein filtering the noise includes wrapping a first conductive coil wrapped, in a first direction relative to a reference point, around a conductor providing the current flow to the heat source, and wrapping a second conductive coil wrapped around the conductor in a second direction opposite the first direction.

19. The method according to claim 18, wherein filtering the noise further includes serially connecting the first conductive coil and the second conductive coil.

20. The device according to claim 19, wherein the first conductive coil and second conductive coil are wrapped around the conductive terminal block in the same direction relative to the current.

* * * * *